United States Patent
Han et al.

(10) Patent No.: US 10,923,433 B2
(45) Date of Patent: Feb. 16, 2021

(54) FAN-OUT SEMICONDUCTOR PACKAGE

(71) Applicant: SAMSUNG ELECTRONICS CO., LTD., Suwon-si (KR)

(72) Inventors: Mi Ja Han, Suwon-si (KR); Dae Hyun Park, Suwon-si (KR); Seong Hwan Lee, Suwon-si (KR); Sang Jong Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/105,942

(22) Filed: Aug. 20, 2018

(65) Prior Publication Data

US 2019/0341353 A1 Nov. 7, 2019

(30) Foreign Application Priority Data

May 4, 2018 (KR) .......................... 10-2018-0051914

(51) Int. Cl.
*H01L 23/49* (2006.01)
*H01L 23/552* (2006.01)
(Continued)

(52) U.S. Cl.
CPC ...... *H01L 23/552* (2013.01); *H01L 23/49822* (2013.01); *H01L 23/562* (2013.01);
(Continued)

(58) Field of Classification Search
CPC . H01L 23/552; H01L 23/49822; H01L 25/16; H01L 2224/08225; H01L 24/08;
(Continued)

(56) References Cited

U.S. PATENT DOCUMENTS 5,835,355 A * 11/1998 Dordi .................... H01L 21/563
361/760
7,772,046 B2  8/2010 Pagaila et al.
(Continued)

FOREIGN PATENT DOCUMENTS

JP  2012-160572 A  8/2012
JP  2013-38162 A   2/2013
(Continued)

OTHER PUBLICATIONS

Communication dated May 7, 2019 issued by the Korean Intellectual Property Office in counterpart Korean Patent Application No. 10-2018-0051914.
(Continued)

*Primary Examiner* — Charles D Garber
*Assistant Examiner* — S M Sohel Imtiaz
(74) *Attorney, Agent, or Firm* — Sughrue Mion, PLLC

(57) ABSTRACT

A fan-out semiconductor package includes a connection member including an insulating layer and a redistribution layer, a semiconductor chip disposed on the connection member, an encapsulant encapsulating the semiconductor chip, and an electromagnetic wave shielding layer disposed on the semiconductor chip and including a plurality of degassing holes. The electromagnetic wave shielding layer includes a first region and a second region in which densities of the degassing holes are different from each other, the first region having a density of the degassing holes higher than a density of the degassing holes in the second region.

24 Claims, 12 Drawing Sheets

(51) Int. Cl.
*H01L 23/498* (2006.01)
*H01L 25/16* (2006.01)
*H01L 23/00* (2006.01)

(52) U.S. Cl.
CPC .............. *H01L 25/16* (2013.01); *H01L 24/08* (2013.01); *H01L 2224/08225* (2013.01)

(58) Field of Classification Search
CPC ............. H01L 23/3128; H01L 2224/18; H01L 23/49827; H01L 23/145; H01L 23/564; H01L 23/5389; H01L 23/49816
See application file for complete search history.

(56) References Cited

U.S. PATENT DOCUMENTS

| | | | | |
|---|---|---|---|---|
| 8,492,196 | B2* | 7/2013 | Pagaila | H01L 23/552 438/106 |
| 2003/0206405 | A1* | 11/2003 | Zu | H05K 1/141 361/792 |
| 2004/0231872 | A1* | 11/2004 | Arnold | H01L 23/49838 174/377 |
| 2005/0077077 | A1* | 4/2005 | Wood | H01L 23/49822 174/202 |
| 2007/0030661 | A1* | 2/2007 | Morris | C23C 30/00 361/818 |
| 2008/0150129 | A1* | 6/2008 | Yasooka | H01L 23/10 257/728 |
| 2009/0294931 | A1 | 12/2009 | Sham et al. | |
| 2011/0156225 | A1* | 6/2011 | Hozoji | H01L 23/66 257/659 |
| 2016/0197059 | A1 | 7/2016 | Lin et al. | |
| 2016/0336249 | A1 | 11/2016 | Kang et al. | |
| 2017/0103951 | A1* | 4/2017 | Lee | H01L 23/295 |
| 2017/0287825 | A1 | 10/2017 | Lee et al. | |
| 2017/0295643 | A1* | 10/2017 | Suzuki | H01L 23/3121 |
| 2017/0301631 | A1 | 10/2017 | Lee et al. | |
| 2017/0330840 | A1 | 11/2017 | Lin et al. | |
| 2018/0047683 | A1 | 2/2018 | Lee et al. | |
| 2018/0053732 | A1 | 2/2018 | Baek et al. | |
| 2018/0076147 | A1 | 3/2018 | Kim et al. | |
| 2018/0076156 | A1 | 3/2018 | Kim et al. | |
| 2019/0122899 | A1 | 4/2019 | Kwon et al. | |

FOREIGN PATENT DOCUMENTS

| | | |
|---|---|---|
| JP | 2013-58513 A | 3/2013 |
| JP | 2017-76790 A | 4/2017 |
| JP | 2017-191835 A | 10/2017 |
| KR | 10-2008-0046049 A | 5/2008 |
| KR | 10-2015-0000173 A | 1/2015 |
| KR | 10-2015-0113660 A | 10/2015 |
| KR | 10-2016-0132749 A | 11/2016 |
| KR | 10-2017-0128781 A | 11/2017 |
| KR | 10-2018-0018232 A | 2/2018 |
| KR | 10-2018-0020849 A | 2/2018 |
| KR | 10-2018-0029398 A | 3/2018 |
| KR | 1020180029822 A | 3/2018 |
| WO | 2010/029819 A1 | 3/2010 |

OTHER PUBLICATIONS

Communication dated Oct. 15, 2019 issued by the Japanese Patent Office in counterpart Japanese Application No. 2018-153350.
Communication dated Jul. 29, 2019 issued by the Taiwan Intellectual Property Office in counterpart Taiwanese Application No. 107128411.
Communication dated Oct. 1, 2019 issued by the Korean Intellectual Property Office in counterpart Korean Application No. 10-2018-0051914.
Communication dated May 26, 2020 issued by the Japanese Patent Office in Japanese Application No. 2018-153350.
Communication dated Dec. 24, 2019, issued by the Taiwanese Patent Office in counterpart Taiwanese Patent Application No. 107128411.

* cited by examiner

FAN-OUT SEMICONDUCTOR PACKAGE

CROSS-REFERENCE TO RELATED APPLICATION(S)

This application claims benefit of priority to Korean Patent Application No. 10-2018-0051914 filed on May 4, 2018 in the Korean Intellectual Property Office, the disclosure of which is incorporated herein by reference in its entirety.

TECHNICAL FIELD

The present disclosure relates to a fan-out semiconductor package.

BACKGROUND

A significant recent trend in the development of technology related to semiconductor chips is to reduce the size of components. Therefore, in a package field, in accordance with a rapid increase in demand for small-sized semiconductor chips, or the like, the implementation of a semiconductor having a compact size, while including a large number of pins, has been demanded.

A type of semiconductor package technology suggested to satisfy the technical demand is a fan-out semiconductor package. Such a fan-out package has a compact size and may allow a large number of pins to be implemented by redistributing connection terminals outwardly of a region in which a semiconductor chip is disposed.

An effective electromagnetic wave shielding structure is required for the semiconductor package, since a problem may occur when electromagnetic waves affect the semiconductor chip, or the like.

SUMMARY

An aspect of the present disclosure is to provide a fan-out semiconductor package having high electromagnetic wave shielding efficiency and capable of effectively removing gas which may occur inside a product.

According to an aspect of the present disclosure, a fan-out semiconductor package includes a connection member including an insulating layer and a redistribution layer, a semiconductor chip disposed on the connection member, an encapsulant encapsulating the semiconductor chip, and an electromagnetic wave shielding layer disposed on the semiconductor chip and including a plurality of degassing holes. The electromagnetic wave shielding layer includes a first region and a second region in which densities of the plurality of degassing holes are different from each other, the first region having a density of the degassing holes higher than a density of the degassing holes in the second region.

The second region may be disposed in a region corresponding to the semiconductor chip.

The electromagnetic wave shielding layer may further include a third region in which the degassing holes are not formed.

The third region may be disposed in a region corresponding to the semiconductor chip.

The fan-out semiconductor package may further include a core member having a through hole in which the semiconductor chip is disposed, and the third region may be disposed in a region corresponding to the core member.

The core member may include a metal layer covering at least a wall surface of the through hole.

The metal layer may extend from the wall surface of the through hole to one or more of an upper surface of the core member or a lower surface of the core member.

The metal layer of the core member and the electromagnetic wave shielding layer may be connected by a conductive via penetrating through the encapsulant.

The fan-out semiconductor package may further include a plurality of passive components disposed on the connection member.

The first region may be disposed in a region corresponding to at least a portion of the plurality of passive components.

Distances from upper surfaces of at least portions of the plurality of passive components to an upper surface of the encapsulant may be different from each other, and a density of the degassing holes may be higher in a region in which a distance to the upper surface of the encapsulant, is longer, among the different distances from the upper surfaces of the at least portions of the plurality of passive components to the upper surface of the encapsulant.

The electromagnetic wave shielding layer may further include a third region in which the degassing holes are not formed, and the third region may be disposed in a region in which a distance to the upper surface of the encapsulant, is shorter, among the different distances from the upper surfaces of the at least portions of the plurality of passive components to the upper surface of the encapsulant.

The plurality of passive components may include a capacitor and an inductor, and a density of the degassing holes in a region corresponding to the capacitor may be higher than a density of the degassing holes in a region corresponding to the inductor.

The electromagnetic wave shielding layer may further include the third region in which the degassing holes are not formed, and the third region may be disposed in a region corresponding to the inductor.

Sizes of the degassing holes in the first region and the second region may be equal to each other, and the number of the degassing holes per unit area in the first region may be higher than that in the second region.

An average size of the plurality of degassing holes may be less than or equal to 60 μm.

The electromagnetic wave shielding layer may include a first layer and a second layer covering the first layer.

The first layer and the second layer may be plating layers.

The second layer may completely cover upper surfaces of the first layer and side surfaces of the first layer.

The electromagnetic wave shielding layer may further include a seed layer completely covered by the first layer.

The fan-out semiconductor package may further include a passivation layer covering the electromagnetic wave shielding layer.

Portions of the passivation layer may fill the plurality of degassing holes of the electromagnetic wave shielding layer.

The portions of the passivation layer filling the plurality of degassing holes of the electromagnetic wave shielding layer may be in direct contact with the encapsulant.

The electromagnetic wave shielding layer may extend continuously between edges of the fan-out semiconductor package.

According to another aspect of the present disclosure, a fan-out semiconductor package includes a connection member including an insulating layer and a redistribution layer, a semiconductor chip disposed on the connection member, an encapsulant encapsulating the semiconductor chip, and an electromagnetic wave shielding layer disposed on the semiconductor chip and including a plurality of degassing holes. The electromagnetic wave shielding layer includes a first layer and a second layer covering the first layer.

The second layer may completely cover upper surfaces of the first layer and side surfaces of the first layer.

The electromagnetic wave shielding layer may further include a seed layer completely covered by the first layer.

According to another aspect of the present disclosure, a fan-out semiconductor package includes a connection member including an insulating layer and a redistribution layer; a core member disposed on the connection member and having first and second through holes spaced apart from each other; a semiconductor chip disposed on the connection member and in the first through hole of the core member; a first passive component disposed on the connection member and in the second through hole of the core member; an encapsulant encapsulating portions of the semiconductor chip, the first passive component, and the core member; and an electromagnetic wave shielding layer disposed on the encapsulant and including degassing holes. In a direction along which at least one of the semiconductor chip, the first passive component, and the core member is stacked on the connection member, a sum of areas of the degassing holes overlapping the first passive component or the semiconductor chip in one unit area is greater than a sum of areas of the degassing holes overlapping a wall of the core member separating the first through hole and the second through hole in one unit area.

A sum of areas of the degassing holes overlapping the semiconductor chip in one unit area may be less than a sum of areas of the degassing holes overlapping the passive component in one unit area.

The degassing holes may not overlap the semiconductor chip and the wall of the core member separating the first through hole and the second through hole.

The fan-out semiconductor package may further include a second passive component disposed on the connection member, and the number of the degassing holes overlapping the second passive component may be less than the number of the degassing holes overlapping the first passive component.

A distance from the electromagnetic wave shielding layer to the second passive component may be less than a distance from the electromagnetic wave shielding layer to the first passive component.

The first passive component may be an inductor component, and the second passive component may be a capacitor.

The fan-out semiconductor package may further include a passivation layer covering the electromagnetic wave shielding layer, and portions of the passivation layer may fill the degassing holes of the electromagnetic wave shielding layer.

The fan-out semiconductor package may further include a metal layer disclosed on a surface of the core member, and electrically connected to the electromagnetic wave shielding layer through a via penetrating the encapsulant.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Electronic Device

Figure 1:
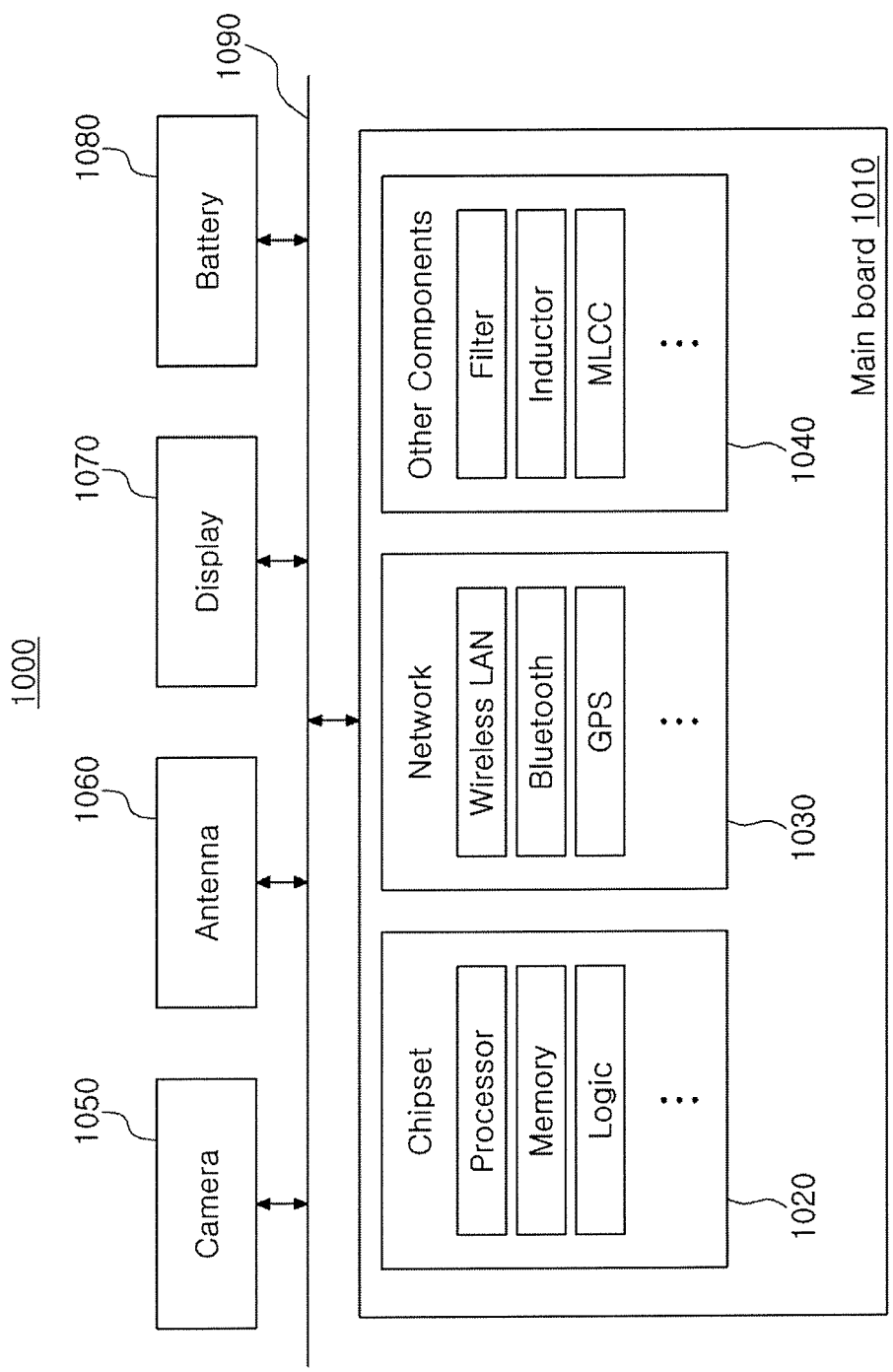
FIG. 1 is a schematic block diagram illustrating an example of an electronic device system.

FIG. 1 is a schematic block diagram illustrating an example of an electronic device system.

Referring to FIG. 1, an electronic device 1000 receives a main board 1010 therein. The main board 1010 may include a chip-related component 1020, a network-related component 1030, other components 1040, and the like, physically and/or electrically connected thereto. The components may be connected to other components to be described below to form various signal lines 1090.

The chip-related component 1020 may include a memory chip such as a volatile memory (for example, a dynamic random access memory (DRAM)), a non-volatile memory, for example, a read only memory (ROM), a flash memory, or the like; an application processor chip such as a central processor (for example, CPU), a graphic processor (for example, GPU), a digital signal processor, a cryptographic processor, a microprocessor, a microcontroller, or the like; and a logic chip such as an analog to digital converter, an application-specific IC (ASIC), or the like. However, the chip-related component 1020 is not limited thereto, but may also include other types of chip-related components. In addition, the components included in the chip-related component 1020 may be combined with each other.

The network-related component 1030 may include protocols such as Wi-Fi (IEEE 802.11 family, or the like), WiMAX (IEEE 802.16 family, or the like), IEEE 802.20, long term evolution (LTE), Ev-DO, HSPA+, HSDPA+, HSUPA+, EDGE, GSM, GPS, GPRS, CDMA, TDMA, DECT, Bluetooth, 3G, 4G, 5G, and any other wireless and wired protocols designated after the above-mentioned protocols. However, the network-related component is not limited thereto, but may also include any of a variety of other wireless or wired standards or protocols. In addition, the components included in the network-related component 1030 may be combined with each other, together with the chip-related component 1020.

Examples of other components 1040 may include a high frequency inductor, a ferrite inductor, a power inductor, ferrite beads, low temperature co-firing ceramics (LTCC), an electromagnetic interference (EMI) filter, a multilayer ceramic condenser (MLCC), or the like. However, other components 1040 are not limited thereto, but may also include passive components for other various uses, and the like. In addition, the components included in the other components 1040 may be combined with each other, together with the chip-related component 1020 and/or the network-related component 1030.

Depending on a type of the electronic device 1000, the electronic device 1000 may include other components which may or may not be physically and/or electrically connected to the main board 1010. Examples of these other components may include a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit, for example, a hard disk drive (not illustrated), a compact disk (CD) (not illustrated), a digital versatile disk (DVD) (not illustrated), or the like. However, the examples of these other components are not limited thereto, and may also include other components for various uses depending on a type of the electronic device 1000, and the like.

The electronic device 1000 may be a smart phone, a personal digital assistant, a digital video camera, a digital still camera, a network system, a computer, a monitor, a tablet PC, a laptop computer, a netbook, a television, a video game device, a smart watch, an automotive component, or the like. However, the electronic device 1000 is not limited thereto, and may be any other electronic device processing data.

Figure 2:
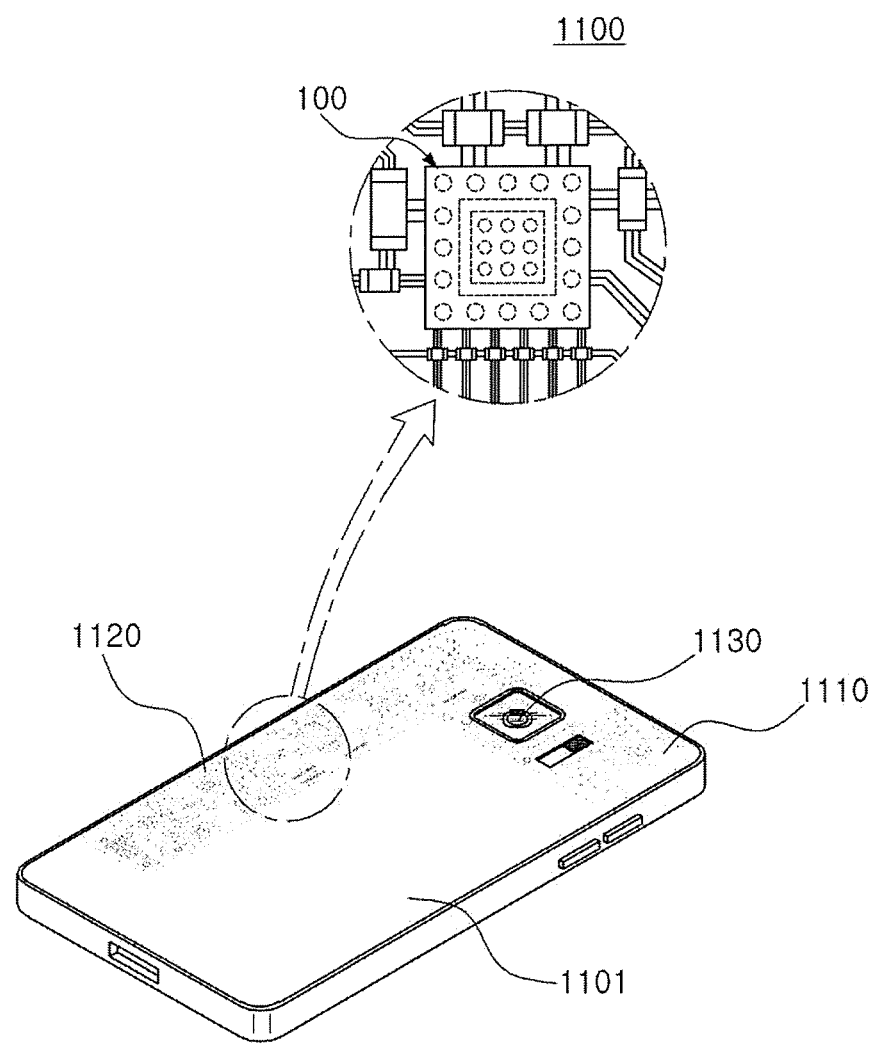
FIG. 2 is a schematic perspective view illustrating an example of an electronic device.

FIG. 2 is a schematic perspective view illustrating an example of an electronic device.

Referring to FIG. 2, a semiconductor package may be applied to various electronic devices described above, for various uses. For example, a mother board 1110 is received inside a body 1101 of a smart phone 1100, and various components 1120 are physically and/or electrically connected in the mother board 1110. In addition, other components which may or may not be physically and/or electrically connected to the main board 1010, such as a camera 1130, may be received in the body 1101. A portion of the components 1120 may be the chip-related component, and a fan-out semiconductor package 100 may be an application processor among chip-related components, but is not limited thereto. The electronic device is not necessarily limited to the smart phone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor itself may not be used, but may be packaged and used in an electronic device or the like, in a packaged state.

The semiconductor packaging is required due to the existence of a difference in a circuit width between the semiconductor chip and a main board of the electronic device in terms of electrical connections. In detail, in the case of the semiconductor chip, the size of connection pads and an interval between the connection pads are relatively fine, while in the case of a main board used in an electronic device, the size of component mounting pads and an interval between the component mounting pads are significantly larger than a scale of the semiconductor chip. Therefore, directly mounting the semiconductor chip on such a main board may be difficult, and thus, packaging technology for buffering a difference in the circuit width between the semiconductor chip and the main board is required.

A semiconductor package manufactured by the packaging technology may be classified as a fan-in semiconductor package and a fan-out semiconductor package, depending on a structure and use thereof.

Hereinafter, the fan-in semiconductor package and the fan-out semiconductor package will be described in more detail with reference to the drawings.

Fan-In Semiconductor Package

Figure 3B:
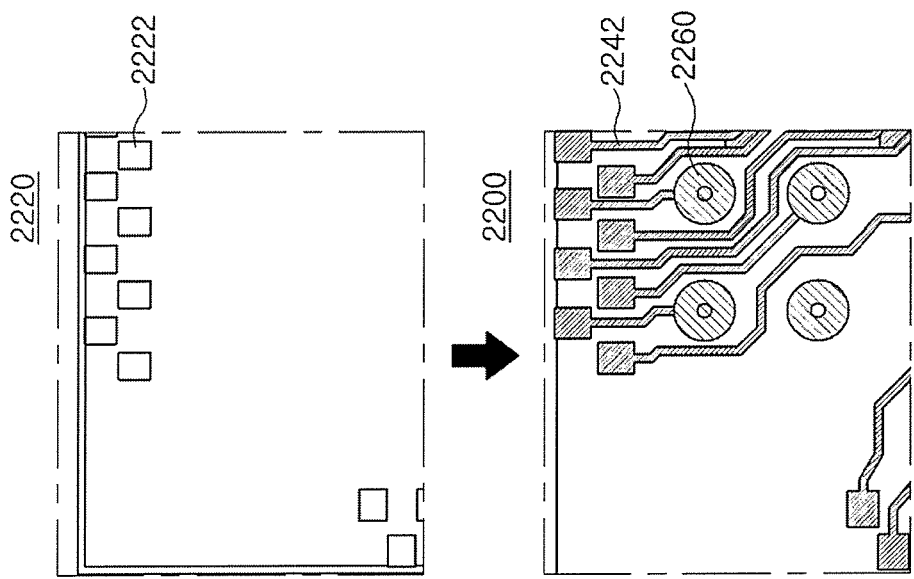
FIGS. 3A and 3B are schematic cross-sectional views illustrating states of a fan-in semiconductor package before and after being packaged.
Figure 3A:
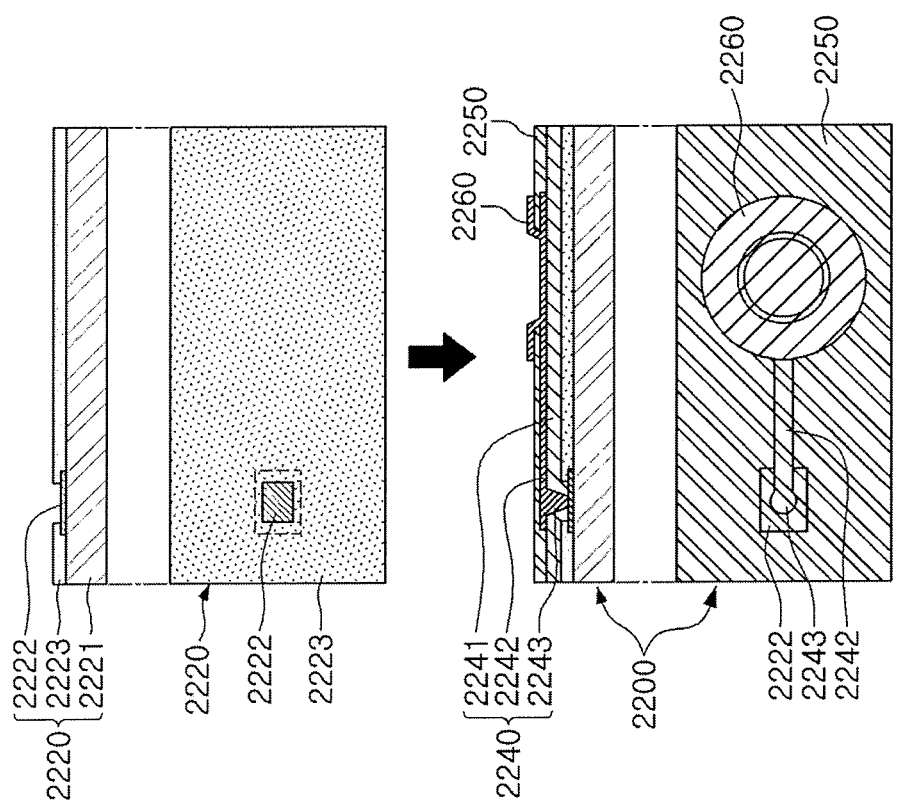

FIGS. 3A and 3B are schematic cross-sectional views illustrating states of a fan-in semiconductor package before and after being packaged.

Figure 4:
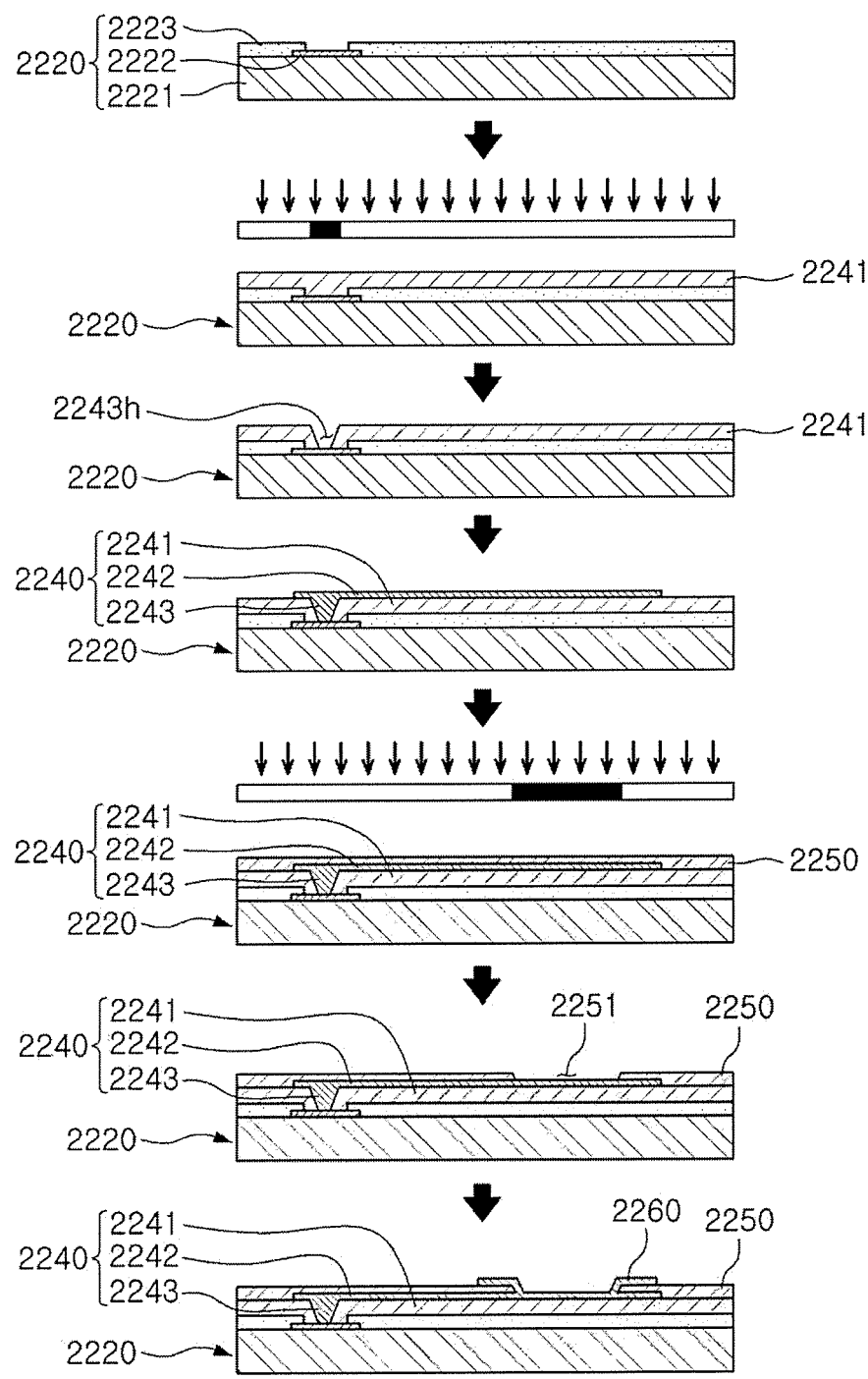
FIG. 4 is a schematic cross-sectional view illustrating a packaging process of a fan-in semiconductor package.

FIG. 4 is a schematic cross-sectional view illustrating a packaging process of a fan-in semiconductor package.

Referring to FIGS. 3A to 4, a semiconductor chip 2220 may be, for example, an integrated circuit (IC) in a bare state, including a body 2221 including silicon (Si), germanium (Ge), gallium arsenide (GaAs), or the like, a connection pad 2222 including a conductive material, such as aluminum (Al) or the like, and formed on one surface of the body 2221, and a passivation layer 2223 such as an oxide film, a nitride film, or the like, formed on one surface of the body 2221 and covering at least a portion of the connection pad 2222. In this case, since the connection pad 2222 is significantly small, the integrated circuit (IC) may be difficult to be mounted on an intermediated level printed circuit board (PCB) as well as on the main board of the electronic device, or the like.

Therefore, a connection member 2240 may be formed on the semiconductor chip 2220, to comply with a size of the semiconductor chip, to redistribute the connection pad 2222. The connection member 2240 may be formed by forming an insulating layer 2241 on the semiconductor chip 2220 using an insulating material such as a photoimagable dielectric (PID) resin, forming a via hole 2243h exposing the connection pad 2222, and then forming a wiring pattern 2242 and a via 2243. Then, a passivation layer 2250 protecting the connection member 2240 may be formed, an opening 2251 may be formed, and then, an under-bump metal layer 2260 and the like, may be formed. In detail, a fan-in semiconductor package 2200 including, for example, the semiconductor chip 2220, the connection member 2240, the passivation layer 2250, and the under-bump metal layer 2260 may be manufactured through a series of processes.

As described above, the fan-in semiconductor package has a package form in which all of the connection pads of the semiconductor chip, for example, input/output (I/O) terminals are disposed inside the device, and may have excellent electrical characteristics and be produced at a relatively low cost. Therefore, a lot of elements mounted in smart phones have been manufactured in a fan-in semiconductor package form, in detail, a lot of elements mounted in smart phones have been developed to implement a rapid signal transfer, while having a compact size.

However, since all I/O terminals need to be disposed inside the semiconductor chip, the fan-in semiconductor package has a relatively great spatial limitation. Therefore, applying such a structure to a semiconductor chip having a relatively high number of I/O terminals or a semiconductor chip having a compact size may be difficult. In addition, due to negative attributes as described above, the fan-in semiconductor package may not be directly mounted and used on the main board of the electronic device. Even in case that a size of the I/O terminals and an interval between the I/O terminals of the semiconductor chip are increased by a redistribution process, the size of the I/O terminals and the interval between the I/O terminals of the semiconductor chip may be insufficient to directly mount the fan-in semiconductor package on the main board of the electronic device.

Figure 5:
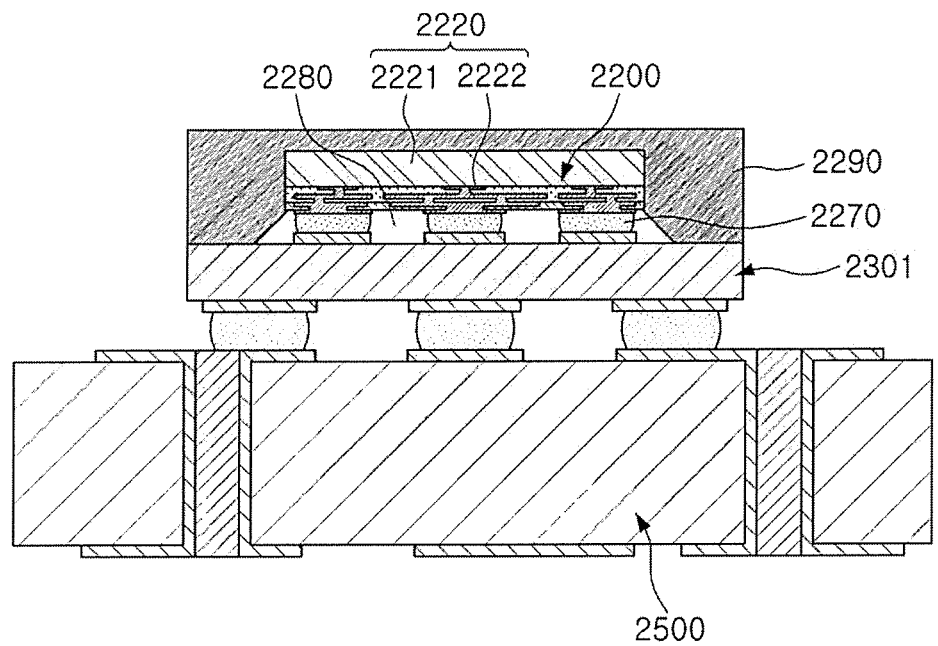
FIG. 5 is a schematic cross-sectional view illustrating a case in which a fan-in semiconductor package is mounted on an interposer substrate and is ultimately mounted on a main board of an electronic device.

FIG. 5 is a schematic cross-sectional view illustrating a case in which a fan-in semiconductor package is mounted on an interposer substrate and is ultimately mounted on a main board of an electronic device.

Figure 6:
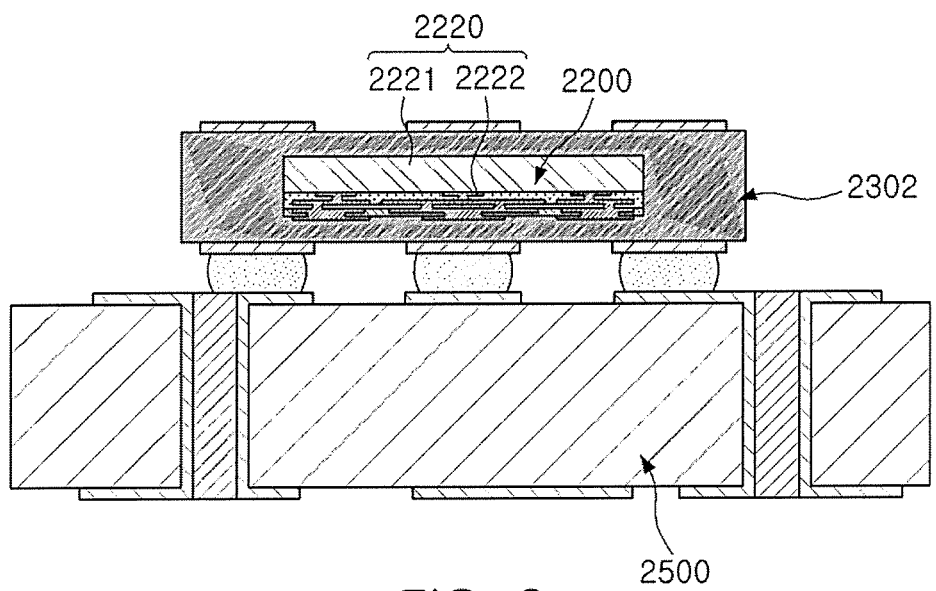
FIG. 6 is a schematic cross-sectional view illustrating a case in which a fan-in semiconductor package is embedded in an interposer substrate and is ultimately mounted on a main board of an electronic device.

FIG. 6 is a schematic cross-sectional view illustrating a case in which a fan-in semiconductor is embedded in an interposer substrate and is ultimately mounted on a main board of an electronic device.

Referring to FIGS. 5 and 6, in a fan-in semiconductor package 2200, connection pads 2222 of the semiconductor chip 2220, for example, input/output (I/O) terminals are redistributed once more through an interposer substrate 2301, and the fan-in semiconductor package 2200 may be ultimately mounted on a main board 2500 of the electronic device in a state in which the fan-in semiconductor package 2200 is mounted on the interposer substrate 2301. In this case, solder balls 2270, and the like, may be fixed by an underfill resin 2280, or the like, and an outer side of the semiconductor chip may be covered with a molding material 2290, or the like. Alternatively, the fan-in semiconductor package 2200 may also be embedded in a separate interposer substrate 2302, the connection pads 2222, for example, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on the main board 2500 of the electronic device.

As described above, it may be difficult to directly mount and use the fan-in semiconductor package on the main board of the electronic device. Therefore, the fan-in semiconductor package is required to be mounted on a separate interposer substrate and then mounted on a main board of the electronic device through a packaging process or to be mounted and used on the main board of the electronic device in a state in which it is embedded in the interposer substrate.

Fan-Out Semiconductor Package

Figure 7:
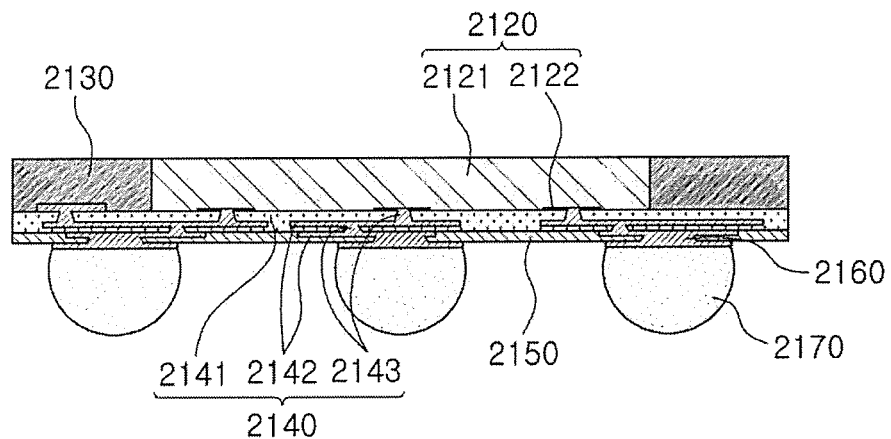
FIG. 7 is a schematic cross-sectional view illustrating a fan-out semiconductor package.

FIG. 7 is a schematic cross-sectional view illustrating a fan-out semiconductor package.

Referring to FIG. 7, in the case of a fan-out semiconductor package, for example, an outer side of a semiconductor chip 2120 may be protected by an encapsulant 2130, and a connection pad 2122 of the semiconductor chip 2120 may be redistributed outwardly of the semiconductor chip by a connection member 2140. In this case, a passivation layer 2202 may further be formed on the connection member 2140, and an under-bump metal layer 2160 may further be formed in an opening of the passivation layer 2202. Solder balls 2170 may be further formed on the under-bump metal layer 2160. The semiconductor chip 2120 may be an integrated circuit (IC) including a body 2121, the connection pad 2122, a passivation film (not illustrated), and the like. The connection member 2140 may include an insulating layer 2141, a redistribution layer 2142 formed on the insulating layer 2241, and vias 2143 electrically connecting the connection pad 2122 and the redistribution layer 2142, and the like.

Thus, the fan-out semiconductor package has a form in which I/O terminals are redistributed and disposed outwardly of the semiconductor chip through the connection member formed on the semiconductor chip. As described above, in the case of the fan-in semiconductor package, all I/O terminals of the semiconductor chip need to be disposed inside the semiconductor chip. Therefore, when a device size is reduced, a size and a pitch of a ball need to be reduced, such that a standardized ball layout itself may not be used in the case of the fan-in semiconductor package. On the other hand, the fan-out semiconductor package has a form in which the I/O terminals of the semiconductor chip are redistributed and disposed outwardly of the semiconductor chip through the connection member formed on the semiconductor chip, and therefore, even in the case in which a size of the semiconductor chip is reduced, the standardized ball layout may be used in the fan-out semiconductor package, as it is, such that the fan-out semiconductor package may be mounted on the main board of the electronic device without using a separate interposer substrate, as described below.

Figure 8:
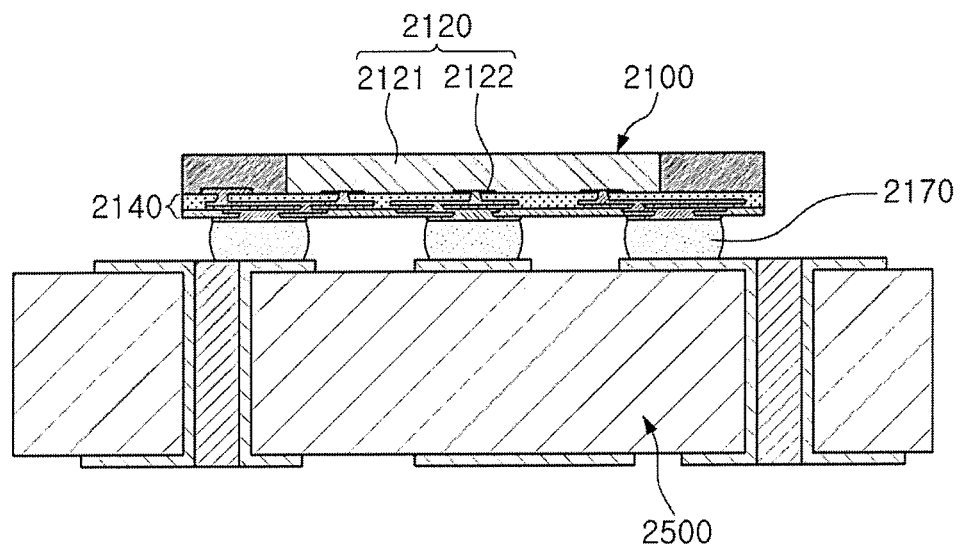
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to FIG. 8, a fan-out semiconductor package 2100 may be mounted on a main board 2500 of an electronic device through solder balls 2170, or the like. In detail, as described above, in the case of the fan-out semiconductor package 2100, a connection member 2140 capable of redistributing the connection pad 2122 to a fan-out region beyond a size of the semiconductor chip 2120 may be formed on the semiconductor chip 2120, such that a standardized ball layout, as it is, may be used in the fan-out semiconductor package. As a result, the fan-out semiconductor package may be mounted on the main board 2500 of the electronic device without using a separate interposer substrate, or the like.

As described above, since the fan-out semiconductor package may be mounted on the main board of the electronic device without using a separate interposer substrate, the fan-out semiconductor package may be implemented to have a reduced thickness, compared with a thickness of the fan-in semiconductor package using the interposer substrate. Therefore, the fan-out semiconductor package may be miniaturized and thinned. In addition, the fan-out semiconductor package may have excellent thermal characteristics and electrical characteristics, to be appropriate for, for example, a mobile product. Further, the fan-out semiconductor package may be implemented to have a more compact size than a size of a general package-on-package (POP) using a printed circuit board (PCB), and may be implemented to prevent a problem occurring due to occurrence of a warpage phenomenon.

The fan-out semiconductor package refers to package technology to protect the semiconductor chip from external impacts, to allow the semiconductor chip to be mounted on the main board of the electronic device, or the like, as described above, and has a concept different from the concept of a printed circuit board (PCB) such as an interposer substrate, or the like, having a scale, usage, and the like, different from those of the fan-out semiconductor package, and having the fan-in semiconductor package embedded therein.

Hereinafter, a fan-out semiconductor package according to exemplary embodiments in the present disclosure will be described with reference to the accompanying drawings.

Figure 9:
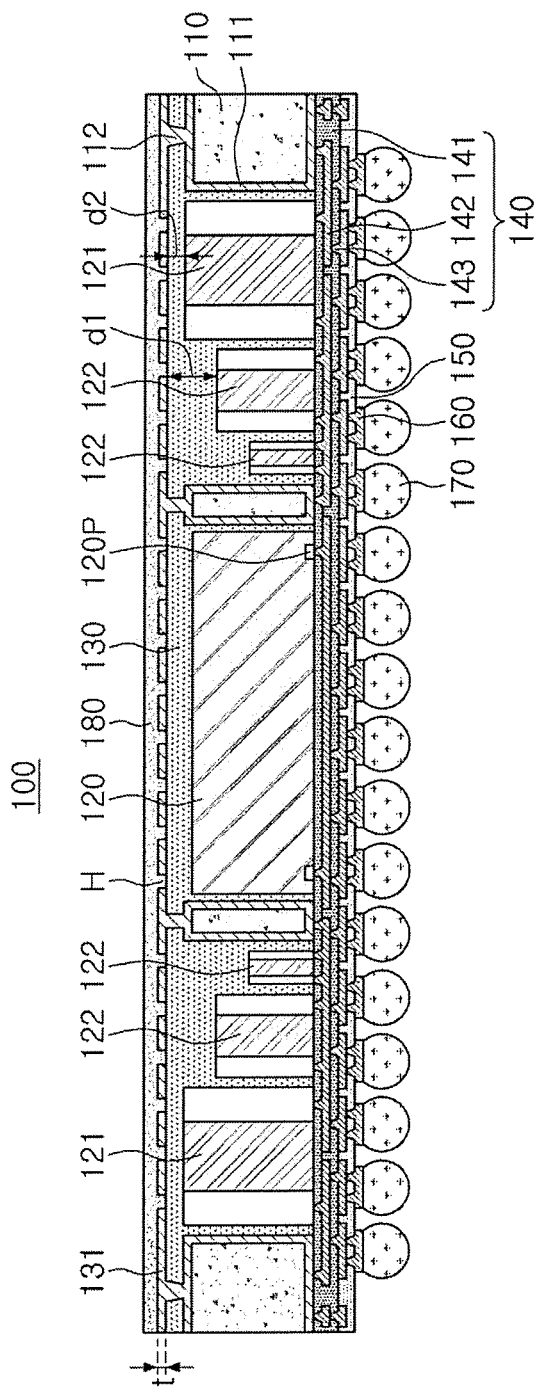
FIGS. 9 and 10 schematically illustrate an example of a fan-out semiconductor package, and correspond to a cross-sectional view and an upper plan view thereof, respectively.
Figure 10:
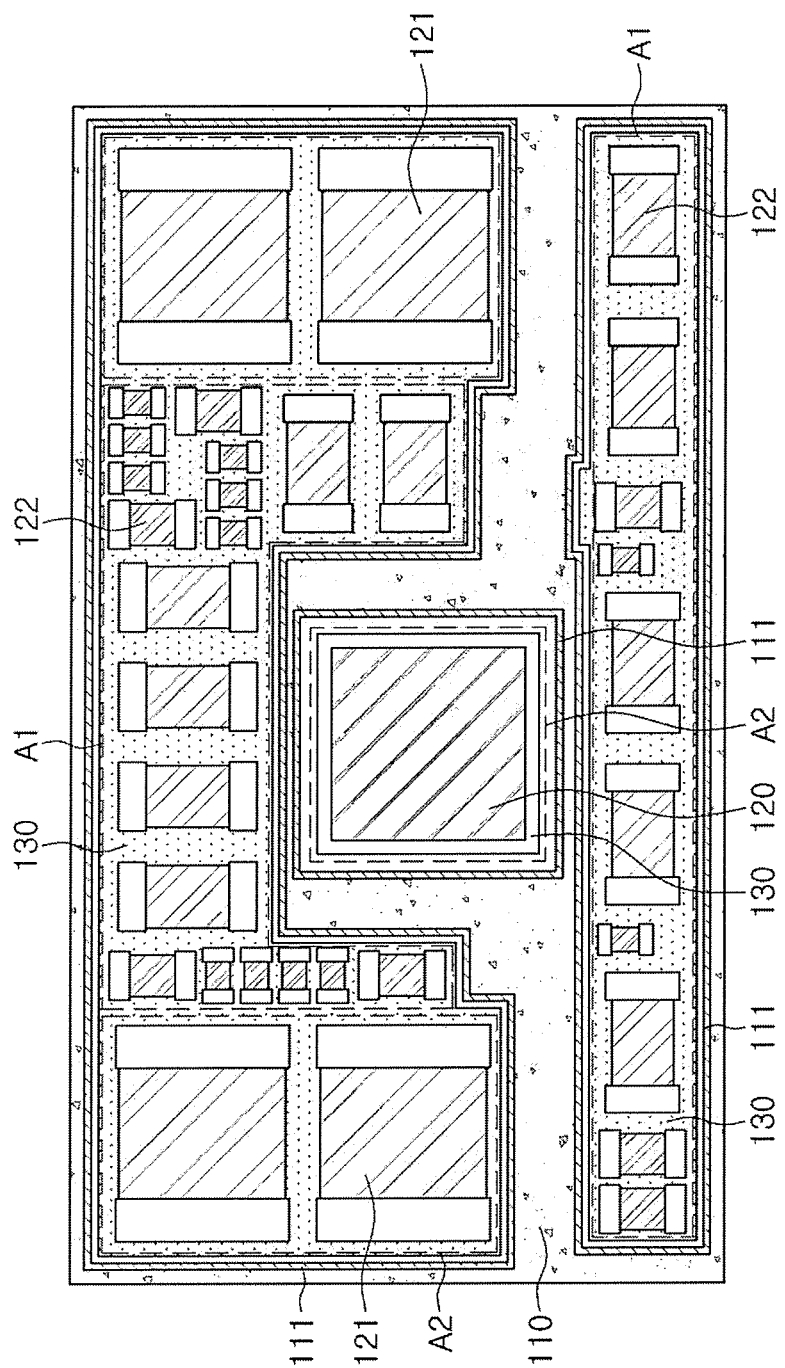
Figure 11:
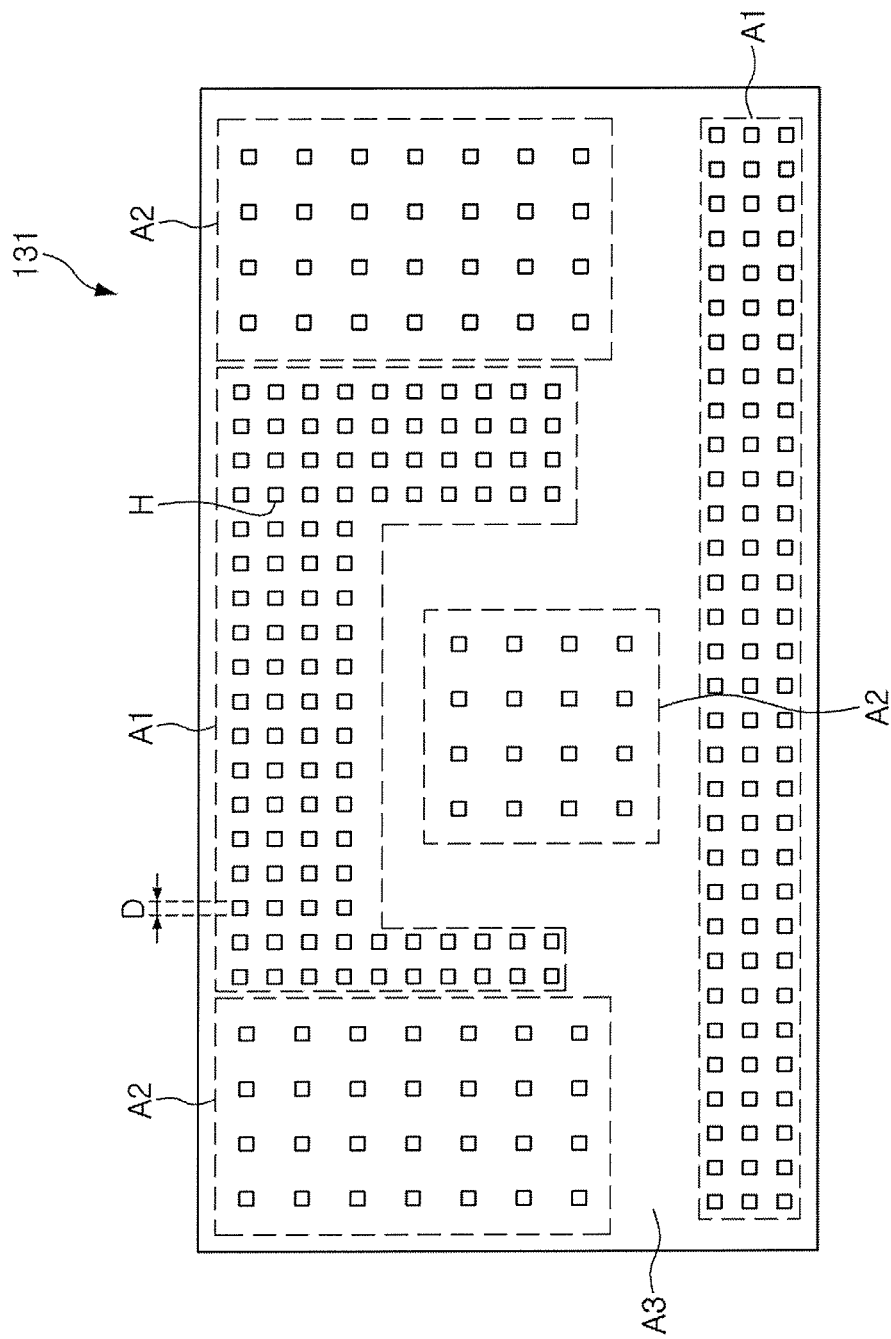
FIG. 11 illustrates a form of an electromagnetic wave shielding layer that may be employed in the exemplary embodiment of FIGS. 9 and 10.
Figure 12:
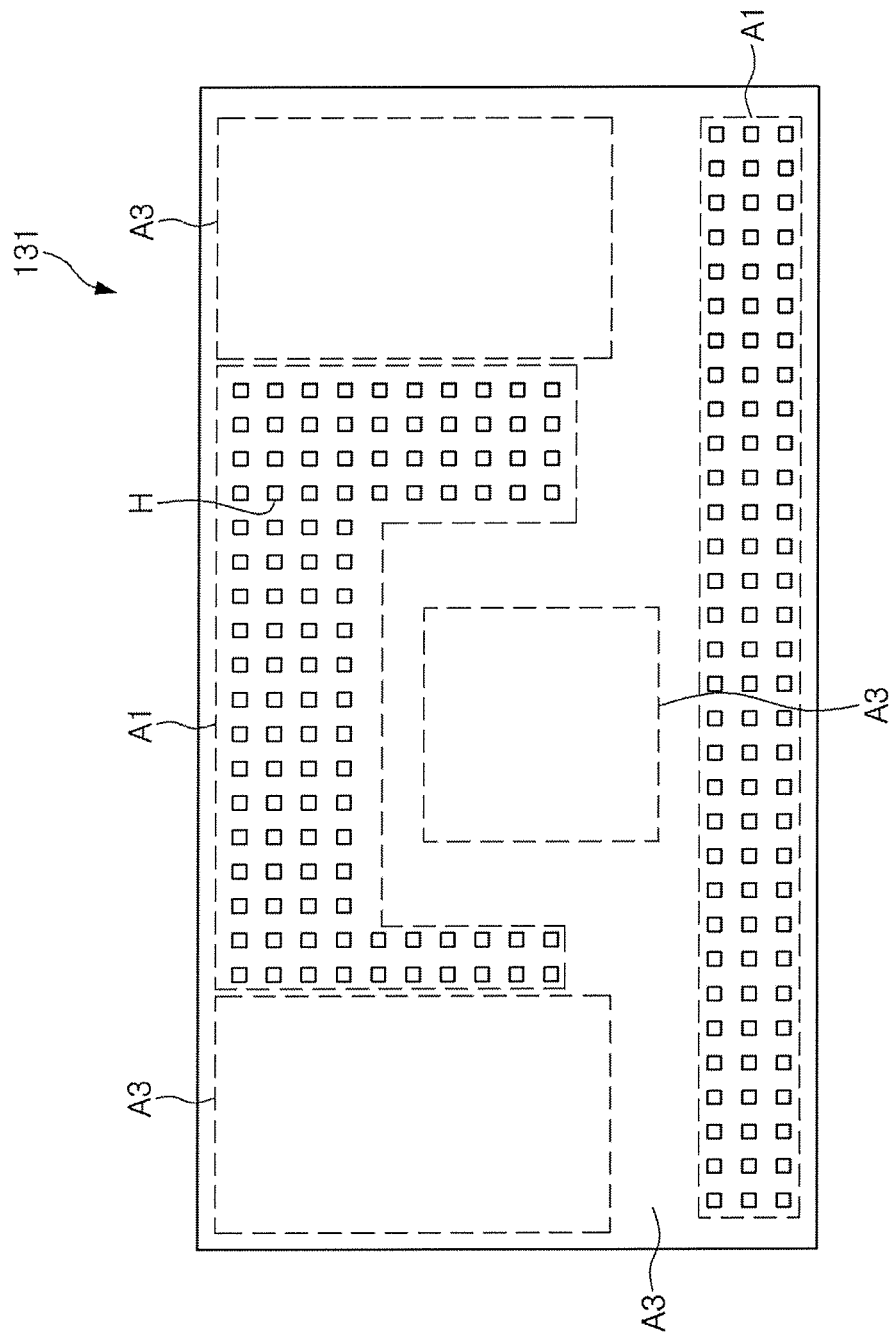
FIG. 12 illustrates a form of an electromagnetic wave shielding layer may be employed in a modified embodiment.
Figure 13:
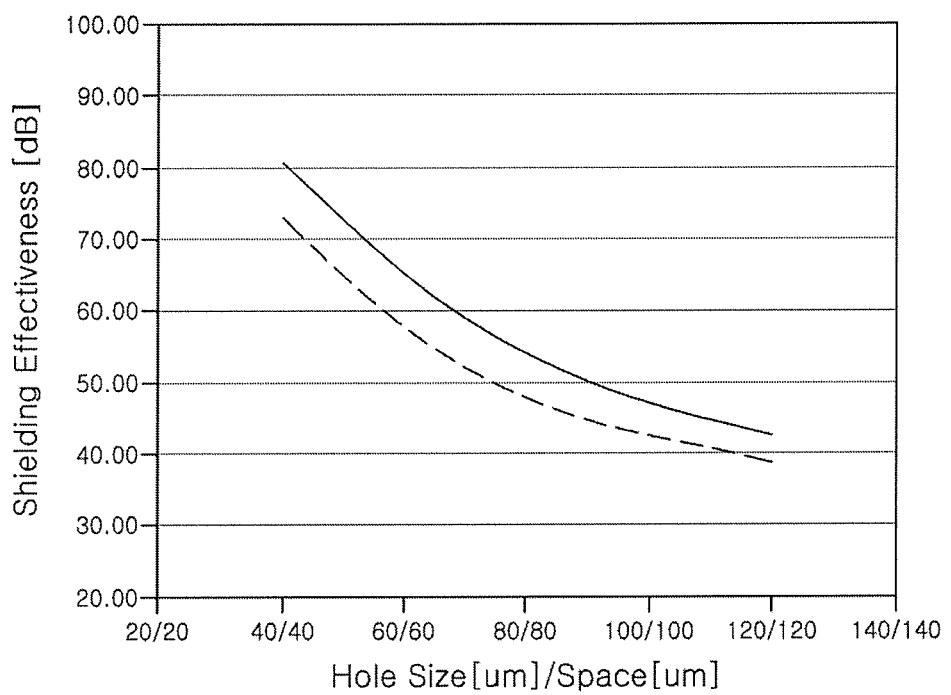
FIG. 13 is a simulation graph illustrating an aspect in which shielding efficiency is changed according to sizes of degassing holes in an electromagnetic wave shielding layer.

FIGS. 9 and 10 schematically illustrate an example of a fan-out semiconductor package, and correspond to a cross-sectional view and an upper plan view, respectively. FIG. 11 illustrates a form of an electromagnetic wave shielding layer that may be employed in the exemplary embodiment of FIGS. 9 and 10. FIG. 12 illustrates a form of an electromagnetic wave shielding layer that may be employed in a modified exemplary embodiment. FIG. 13 is a simulation graph illustrating a change in shielding efficiency depending on the size of degassing holes in the electromagnetic wave shielding layer.

Referring to FIGS. 9 and 10, a fan-out semiconductor package 100 according to an exemplary embodiment may include a semiconductor chip 120, an encapsulant 130, a connection member 140, and an electromagnetic wave shielding layer 131. The electromagnetic wave shielding layer 131 may include a plurality of degassing holes H, to provide gas exhaust paths. In addition, the fan-out semiconductor package 100 may include a core member 110, passive components 121 and 122, passivation layers 150 and 180, an under-bump metal layer 160, an electrical connection structure 170, and the like.

The connection member 140 may redistribute a connection pad 120P of the semiconductor chip 120. Further, when the passive components 121 and 122 are provided, the connection member 140 may electrically connect the semiconductor chip 120 and the passive components 121 and 122. To implement such a function, the connection member 140 may include an insulating layer 141, a redistribution layer 142 disposed on the insulating layer 141, and a via 143 penetrating through the insulating layer 141 to allow the redistribution layer 142 to be connected thereto. The connection member 140 may be formed of a single layer, or may be designed to be formed of a plurality of layers, more than that illustrated in the drawing.

As a material forming the insulating layer 141, for example, a photosensitive insulating material may be used. For example, the insulating layer 141 may be provided as a photosensitive insulating layer. For example, when the insulating layer 141 has a photosensitive property, the insulating layer 141 may be formed to have a relatively reduced thickness, and a fine pitch of the via 143 may be more easily obtained. The insulating layer 141 may be a photosensitive insulating layer including an insulating resin and an inorganic filler. For example, when the insulating layer 141 has multiple layers, materials thereof may be the same as each other, and may also be different from each other as needed. When the insulating layer 141 is formed of multiple layers, the multiple layers may be integrated with each other according to the process, such that a boundary therebetween may not be readily apparent.

The redistribution layer 142 may serve to redistribute the connection pads 120P, and as a material of the redistribution layer, a conductive material such as copper (Cu), aluminum (Al), silver (Ag), tin (Sn), gold (Au), nickel (Ni), lead (Pb), titanium (Ti), or alloys thereof may be used. The redistribution layer 142 may perform various functions depending on designs of relevant layers. For example, a ground pattern, a power pattern, a signal pattern, and the like may be included in the redistribution layer. In this case, the signal pattern may include various signals except for the ground pattern, the power pattern, and the like, for example, data signals and the like. In addition, the redistribution layer may include a via pad, a connection terminal pad, and the like.

The via 143 electrically connects the redistribution layer 142, the connection pad 120P, and the like, formed on different layers each other, resulting in forming electrical connection paths in the fan-out semiconductor package 100. The via 143 may be formed of a conductive material such as copper (Cu), aluminum (Al), tin (Sn), gold (Au), nickel (Ni), lead (Pb), titanium (Ti), or alloys thereof. The via 143 may be completely filled with the conductive material, or the conductive material may be formed along a wall of the via. In addition, as a shape of the via 143, all of shapes known in the art, such as a tapered shape, a cylindrical shape, and the like may be used.

The semiconductor chip 120 is disposed on the connection member 140, and may be an integrated circuit (IC). The semiconductor chip 120, may be a processor chip, for example, such as a central processor (for example, CPU), a graphics processor (for example, GPU), a field programmable gate array (FPGA), a digital signal processor, a cryptographic processor, a microprocessor, a microcontroller, and the like, in detail, may be an application processor (AP), but is not limited thereto.

The semiconductor chip 120 may be formed on the basis of an active wafer. In this case, a base material of a body may be silicon (Si), germanium (Ge), gallium arsenide (GaAs), or the like. Various circuits may be formed in the body. The connection pad 120P may electrically connect the semiconductor chip 120 to other components, and as a forming material thereof, a conductive material such as aluminum (Al) may be used without any particular limitation. A passivation film exposing the connection pads may be formed on the body, the passivation film may be an oxide film, a nitride film or the like, or may be a double later of the oxide film and the nitride film. An insulating layer, or the like may be further disposed on a required position. Although the semiconductor chip 120 may be a bare die, a redistribution layer may be further formed on an active surface as required.

The passive components 121 and 122 may be disposed on the connection member 140, in addition to the semiconductor chip 120. The passive components 121 and 122 may include an inductor 121, a capacitor 122, and the like. In this case, portions of the passive components 121 and 122 may have different sizes, and for example, a size of the inductor 121 may be larger than a size of the capacitor 122. In addition to such a difference in size, in the case of the inductor 121, since necessity of electromagnetic wave shielding is relatively high in terms of inductor component characteristics, the electromagnetic wave shielding layer 131 may be designed based on the inductor according to the exemplary embodiment, which will be described later. Further, the passive components 121 and 122 may include a resistive element in addition to the inductor 121 and the capacitor 122.

The encapsulant 130 may encapsulate the semiconductor chip 120, the passive components 121 and 122, and the like. The encapsulant 130 includes an insulating material. As the insulating material, a material including an inorganic filer and an insulating resin, for example, a thermosetting resin such as an epoxy resin, a thermoplastic resin such as polymide, or a resin in which a reinforcing material such as the inorganic filer is included in the resins as described above, in detail, an ABF, FR-4, BT resin, and the like may be used. In addition, a molding material known in the art, such as an EMC or the like, may also be used, and, a photoimagable encapsulant (PIE) may be also used as needed. As needed, a material in which the insulating resin such as the thermosetting resin or the thermoplastic resin is impregnated in a core material such as the inorganic filler and/or a glass fiber (or a glass cloth, or a glass fabric) may be used.

A core member 110 may be disposed on the connection member 140, and may have a through hole in which the semiconductor chip 120, and the like, are disposed. In a case in which the fan-out semiconductor package 100 packages the semiconductor chip 120 and the passive components 121 and 122, a plurality of through holes may be provided. For example, the semiconductor chip 120 may be disposed in one of the plurality of holes, and portions of the passive components 121 and 122 may be disposed in another one or more of the plurality of holes. The core member 110 may further improve rigidity of the fan-out semiconductor package 100 and may serve to ensure uniformity of the thickness of the encapsulant 130. A material of the core member 110 is not particularly limited. For example, an insulating material may be used, and as the insulating material, a thermosetting resin such as an epoxy resin, a thermoplastic resin such as polymide, or a resin in which such resins are impregnated in a core material such as a glass fiber (or a glass cloth or a glass fabric), together with an inorganic filler, for example, a prepreg, an Ajinomoto Build-up Film (ABF), a FR-4, a BismaleimideTriazine (BT), or the like may be used. As needed, a photoimagable dielectric (PID) resin may also be used.

The core member 110 may include a metal layer 111 covering a wall surface forming a through hole. The metal layer 111 may effectively shield electromagnetic waves emitted from the semiconductor chip 120 and the passive components 121 and 122. As illustrated, the metal layer 111 may extend to an upper surface and a lower surface of the core member 110, and may be connected to the electromagnetic wave shielding layer 131 by conductive vias 112 penetrating through the encapsulant 130.

The electromagnetic wave shielding layer 131 may be disposed on the upper part of the semiconductor chip 120 and the like, and may include a material effectively shield an electromagnetic wave, for example, a metal component. The electromagnetic wave shielding layer 131 includes a plurality of degassing holes H. The electromagnetic wave shielding layer 131 may extends continuously between side surfaces of the fan-out semiconductor package 100. In case that shielding effect is enhanced by disposing the metal layer 111 and the electromagnetic wave shielding layer 131 on the periphery of the semiconductor chip 130 and the like, gas generated from the encapsulant 130 and the like may be difficult to be emitted externally. In the case of the exemplary embodiment in the present disclosure, the degassing holes H may be formed to penetrate through the electromagnetic wave shielding layer 131 in a thickness direction of the shielding layer 131, such that gas may be effectively emitted. Furthermore, as illustrated in FIGS. 10 and 11, the electromagnetic wave shielding layer 131 may include a first region A1 and a second region A2 having different formation densities of the degassing holes H, and in this case, the formation density of the degassing holes H in the first region is higher than that in the second region A2. In the exemplary embodiment, in a region in which necessity of electronic wave shielding is relatively high, the formation density of the degassing holes H may be reduced or the degassing holes H may not be formed, while in a region in which the necessity of electromagnetic wave shielding is not high, or gas emission efficiency should be relatively high, the formation density of the degassing holes H may be designed differently for respective regions of the electromagnetic wave shielding layer 131, to increase the formation density of the degassing holes H.

The formation density of the degassing holes H may be defined as an area occupied by the degassing holes H per unit area in the electromagnetic wave shielding layer 131. For example, when the sizes of the degassing holes H are equal to each other in the first region A1 and the second region A2, the number of degassing holes H per unit area in the first region A1 may be relatively high as compared with that in the second region A2. Further, in the exemplary embodiment, the degassing holes H may be finely formed to significantly reduce a decrease in the electromagnetic wave shielding efficiency. In addition, the sizes of the degassing holes H may be different from each other in the first region A1 and the second region A2. A simulation graph of FIG. 13 illustrates a change in the shielding efficiency depending on sizes of the degassing holes, a dotted line indicates a case in which a thickness t of the electromagnetic wave shielding layer is 10 µm, a solid line indicates a case in which the thickness t of the electromagnetic wave shielding layer is 20 µm. The measurement of the electromagnetic wave shielding efficiency was performed at a distance of about 1 mm from the electromagnetic wave shielding layer at a frequency of 1 GHz. As a result of the present experiment, a case in which the electromagnetic wave shielding effectiveness is 60 dB or more may be determined to have excellent electromagnetic wave shielding effectiveness, and thus, an average size D of the degassing holes H may be about 60 µm or less. In this case, the size D of the degassing hole H and a gap between the degassing holes H may be employed at similar levels, and may have substantially the same value. In detail, the size D of the degassing hole H indicates a diameter of the degassing hole H, and refers to an equivalent circular diameter when a bottom surface of the degassing hole H is not a circle. An equivalent circular diameter $D_{equ}$ may be defined by equation $A_{hole} = \pi \cdot (D_{equ}/2)^2$, in which $A_{hole}$ is an area of the bottom surface of a non-circle degassing hole.

On the other hand, the second region A2 having relatively low formation density of the degassing holes H in the electromagnetic wave shielding layer 131 may be disposed in a region corresponding to the semiconductor chip 120. In other words, as illustrated in FIG. 11, considering a relatively large amount of electromagnetic waves emitted from the semiconductor chip 120, the electromagnetic wave shielding layer 131 may be disposed in such a manner that the second region A2 thereof, having a relatively low formation density of the degassing holes H, is provided in the region corresponding thereto. In addition, in the case of the passive components 121 and 122, a relatively large amount of degassing holes H may be disposed considering the necessity of electromagnetic wave shielding being relatively low, to improve gas emission efficiency. In detail, the first region A1 of the electromagnetic wave shielding layer 131 may be a region corresponding to at least a portion of the plurality of passive components 121 and 122. In this case, the formation density of the degassing holes H may be adjusted in a region of the electromagnetic wave shielding layer 131, corresponding thereto, depending on the size of the kind of the passive components 121 and 122.

In detail, as illustrated in FIG. 9, at least portions of the plurality of the passive components 121 and 122 may have different distances d1 and d2 from upper surfaces thereof to an upper surface of the encapsulant 130. In this case, the formation density of the degassing holes H may be relatively high in a region corresponding to the passive component 122 having a longer distance to the upper surface of the encapsulant 130, among the at least the portions of the plurality of the passive components 121 and 122 having different distances. In other words, the first region A1 may be disposed in a region corresponding to a relatively small passive component 122, and the second region A2 may be disposed in a region corresponding to a relatively large passive component 121. In the case of a relatively small passive component 122, since the thickness of the encapsulant 130 is relatively thick, the amount of gas emitted may be great, and thus, a relatively high number of degassing holes H may be formed in the electromagnetic wave shielding layer 131, while in the case of a relatively large passive component 121, a relatively small number of degassing holes H may be formed.

In addition, as described above, the plurality of passive components 121 and 122 may include the inductor 121, the capacity 122, and the like, and the formation density of the degassing holes H may be relatively high in the region corresponding to the capacitor 122. In other words, as illustrated in FIGS. 10 and 11, the first region A1 may correspond to the capacitor 122, and the second region A2 may correspond to the inductor 121. The shielding efficiency may be prevented from being lowered, by lowering the formation density of the degassing holes H in the region corresponding to the inductor 121 in which the emission of the electromagnetic waves is relatively high. Further, although the exemplary embodiment illustrates that the size of the inductor 121 is larger than the size of the capacitor 122, the inductor 121 does not necessarily have to larger than the capacitor 122.

As illustrated in FIG. 11, the electromagnetic wave shielding layer 131 may further include a third region A3 in which the degassing holes H are not formed and the third region A3 may be disposed in a region corresponding to a core member 110 having relatively low necessity for gas emission. Thus, the electromagnetic wave shielding performance may be significantly increased without lowering the gas emission efficiency. Further, while the degassing holes H are disposed in the regions corresponding to the semiconductor chip 120 or the inductor 121 at a relatively low formation density in the above-described embodiment, the degassing holes H may not be disposed to further improve the electromagnetic wave shielding performance, as illustrated in a modified example of FIG. 12. In this case, the third region A3 having no degassing holes may be disposed to correspond to the semiconductor chip 120. In addition, the third region A3 may be disposed in a region in which a distance to the upper surface of the encapsulant 130, is shorter, among different distances from the upper surfaces of the at least portions of the plurality of passive components to the upper surface of the encapsulant. In addition, the third region A3 may be disposed in a region corresponding to the inductor 121 of the passive components 121 and 122. On the other hand, the second region A2 does not necessarily include the degassing holes H, and for example, in a case in which the second region A2 does not include the degassing holes H (according to an exemplary embodiment in FIG. 12) and thus, the second region A2 corresponding to that shown in FIG. 11 is denoted by the third region A3 in FIG. 12, the second region A2 and the third region A3 may not be required to be separately divided.

Hereinafter, other components will be described. A passivation layer 150 may protect the connection member 140 from external physical chemical damage, or the like. The passivation layer 150 may have an opening exposing at least a portion of the redistribution layer 142 of the connection member 140. The opening may be formed in the passivation layer 150 in several tens to several thousand. The passivation layer 150 includes an insulating resin and an inorganic filler, but may not include glass fibers. For example, the passivation layer 150 may be an Ajinomoto Build-up Film (ABF), but is not limited thereto.

An under-bump metal layer 160 improves the connection reliability of an electrical connection structure 170, and as a result, may improve board level reliability of the fan-out semiconductor package 100. The under-bump metal layer 160 is connected to the redistribution layer 142 of the connection member 140 exposed through the opening of the passivation layer 150. The under-bump metal layer 160 may be formed in the opening, using a conductive material known in the art, for example, a metal, by a metallization method using the metal known in the art, but is not limited thereto.

The electrical connection structure 170 may be an additional configuration to physically and/or electrically connect the fan-out semiconductor package 100 externally. For example, the fan-out semiconductor package 100 may be mounted on a main board of an electronic device through the electrical connection structure 170. The electrical connection structure 170 may be formed of a conductive material, for example, a solder, or the like, by way of an example and the material is not particularly limited thereto. The electrical connection structure 170 may be a land, a ball, a pin, or the like. The electrical connection structure 170 may be formed of multiple layers or a single layer. In the case of multiple layers, the electrical connection structure 170 may include a copper pillar and the solder, and in the case of a single layer, the electrical connection structure 170 may include tin-silver solder or copper, by way of an example. Thus, a material thereof is not limited thereto. The number, gap, form of disposition, and the like of the electrical connection structures 170 are not particularly limited, and may be variously modified based on the design specifications in the art. For example, the number of the electrical connection structures 170 may be provided in an amount of several tens to several thousands, depending on the number of the connection pads 120P, and may also be provided in a larger or smaller amount.

At least one of the electrical connection structures 170 is disposed in the fan-out region. The fan-out region means a region outside of the region in which the semiconductor chip 120 is disposed. The fan-out package is more reliable than the fan-in package, may implement multiple I/O terminals, and facilitate 3D interconnection. In addition, the fan-out package may be manufactured thinner than a ball grid array (BGA), a land grid array (LGA) package, or the like, and may be excellent in price competitiveness.

A passivation layer 180 is disposed on an upper part of the electrical wave shielding layer to protect the electromagnetic wave shielding layer 131 from external physical and chemical damage, and the like. The passivation layer 180 includes an insulating resin and an inorganic filler, but may not include glass fibers. For example, the passivation layer 180 may be an Ajinomoto Build-up Film (ABF), but is not limited thereto. Portions of the passivation layer 180 may fill the plurality of degassing holes H. The portions of the passivation layer 180 filling the plurality of degassing holes H may be in direct contact with the encapsulant 130.

Figure 14:
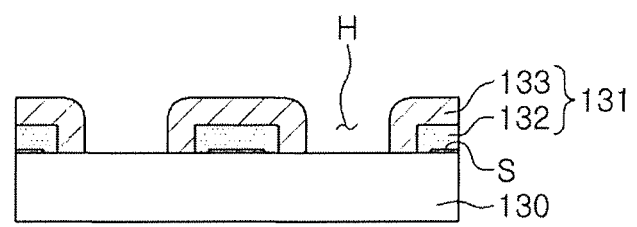
FIGS. 14 and 15 illustrate a detailed form of an electromagnetic wave shielding layer which may be employed in a modified example.
Figure 15:
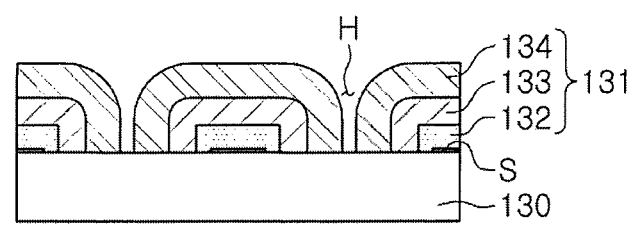

FIGS. 14 and 15 illustrate a detailed form of the electromagnetic wave shielding layer that may be employed in a modified example. As described above, when the electromagnetic wave shielding layer 131 is lowered to a level of several tens of μs, the degassing holes H may be formed without significantly lowering the electromagnetic wave shielding efficiency, such that the degassing holes H need to be formed finely. When the holes are physically formed in the electromagnetic wave shielding layer 131, to form the degassing holes H have a fine size may be difficult.

In the present modified example, the electromagnetic wave shielding layer 131 is formed in multiple layer structure, as illustrated in FIG. 14, the electromagnetic wave shielding layer 131 may include a first layer 132 and a second layer 133 covering the first layer 132. In detail, a hole is formed in the first layer 132, and then the second layer 133 is formed on the upper surface of the first layer 132 and the wall surface of the hole to form fine degassing holes H. The first layer 132 and the second layer 133 may be a plating layer including Cu, or the like, and for this, a seed metal layer S may be applied. In addition, as illustrated in FIG. 15, the electromagnetic wave layer 131 may have relatively fine size of degassing holes H formed in a three-layer structure including the first layer 132, the second layer 133, and a third layer 134.

A region of an electromagnetic wave shielding layer corresponding to an element such as a passive element, a semiconductor chip, and a core member, means that such a region overlaps with such an element in a thickness direction of a fan-out semiconductor package. Here, the thickness direction refers to a stacking direction along which layers of the fan-out semiconductor package are stacked on each other.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

As set forth above, according to an exemplary embodiment in the present disclosure, a fan-out semiconductor package having relatively high electromagnetic wave shielding efficiency and further, capable of effectively removing gas which may occur inside the product may be implemented.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
a connection member including an insulating layer and a redistribution layer;
a semiconductor chip disposed on the connection member;
an encapsulant encapsulating the semiconductor chip; and
an electromagnetic wave shielding layer disposed on the semiconductor chip, and including a plurality of degassing holes,
wherein the electromagnetic wave shielding layer includes a first region and a second region in which densities of the plurality of degassing holes are different from each other, the first region having a density of the degassing holes higher than a density of the degassing holes in the second region.

2. The fan-out semiconductor package according to claim 1, wherein the second region is disposed in a region corresponding to the semiconductor chip.

3. The fan-out semiconductor package according to claim 1, wherein the electromagnetic wave shielding layer further comprises a third region in which the degassing holes are not formed.

4. The fan-out semiconductor package according to claim 3, wherein the third region is disposed in a region corresponding to the semiconductor chip.

5. The fan-out semiconductor package according to claim 3, further comprising a core member having a through hole in which the semiconductor chip is disposed,
wherein the third region is disposed in a region corresponding to the core member.

6. The fan-out semiconductor package according to claim 5, wherein the core member comprises a metal layer covering at least a wall surface of the through hole.

7. The fan-out semiconductor package according to claim 6, wherein the metal layer extends from the wall surface of the through hole to one or more of an upper surface of the core member or a lower surface of the core member.

8. The fan-out semiconductor package according to claim 7, wherein the metal layer of the core member and the electromagnetic wave shielding layer are connected by a conductive via penetrating through the encapsulant.

9. The fan-out semiconductor package according to claim 1, further comprising a plurality of passive components disposed on the connection member.

10. The fan-out semiconductor package according to claim 9, wherein the first region is disposed in a region corresponding to at least a portion of the plurality of passive components.

11. The fan-out semiconductor package according to claim 9, wherein distances from upper surfaces of at least portions of the plurality of passive components to an upper surface of the encapsulant are different from each other, and a density of the plurality of degassing holes is higher in a region in which a distance to the upper surface of the encapsulant, is longer, among the different distances from the upper surfaces of the at least portions of the plurality of passive components to the upper surface of the encapsulant.

12. The fan-out semiconductor package according to claim 11, wherein the electromagnetic wave shielding layer further comprises a third region in which the degassing holes are not formed, and the third region is disposed in a region in which a distance to the upper surface of the encapsulant, is shorter, among the different distances from the upper surfaces of the at least portions of the plurality of passive components to the upper surface of the encapsulant.

13. The fan-out semiconductor package according to claim 9, wherein the plurality of passive components comprise a capacitor and an inductor, and a density of the degassing holes in a region corresponding to the capacitor is higher than a density of the degassing holes in a region corresponding to the inductor.

14. The fan-out semiconductor package according to claim 13, wherein the electromagnetic wave shielding layer further comprises a third region in which the degassing holes are not formed, and the third region is disposed in a region corresponding to the inductor.

15. The fan-out semiconductor package according to claim 1, wherein sizes of the degassing holes in the first region and the second region are equal to each other, and the number of the degassing holes per unit area in the first region is higher than that in the second region.

16. The fan-out semiconductor package according to claim 1, wherein an average size of the plurality of degassing holes is less than or equal to 60 μm.

17. The fan-out semiconductor package according to claim 1, wherein the electromagnetic wave shielding layer comprises a first layer and a second layer covering the first layer.

18. The fan-out semiconductor package according to claim 17, wherein the first layer and the second layer are plating layers.

19. The fan-out semiconductor package according to claim 17, wherein the second layer completely covers upper surfaces of the first layer and side surfaces of the first layer.

20. The fan-out semiconductor package according to claim 19, wherein the electromagnetic wave shielding layer further comprises a seed layer completely covered by the first layer.

21. The fan-out semiconductor package according to claim 1, further comprising a passivation layer covering the electromagnetic wave shielding layer.

22. The fan-out semiconductor package according to claim 21, wherein portions of the passivation layer fill the plurality of degassing holes of the electromagnetic wave shielding layer.

23. The fan-out semiconductor package according to claim 22, wherein the portions of the passivation layer filling the plurality of degassing holes of the electromagnetic wave shielding layer are in direct contact with the encapsulant.

24. The fan-out semiconductor package according to claim 1, wherein the electromagnetic wave shielding layer extends continuously between edges of the fan-out semiconductor package.

* * * * *